(12) United States Patent
Ide et al.

(10) Patent No.: US 12,407,361 B2
(45) Date of Patent: Sep. 2, 2025

(54) DIGITAL CONTROL REGULATOR

(71) Applicant: SONY SEMICONDUCTOR SOLUTIONS CORPORATION, Kanagawa (JP)

(72) Inventors: Daisuke Ide, Kanagawa (JP); Nobuhiko Shigyo, Kanagawa (JP); Keita Komagata, Kanagawa (JP); Hiroyuki Watanabe, Kanagawa (JP); Takahiro Naito, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 140 days.

(21) Appl. No.: 18/245,870

(22) PCT Filed: Sep. 27, 2021

(86) PCT No.: PCT/JP2021/035375
§ 371 (c)(1),
(2) Date: Mar. 17, 2023

(87) PCT Pub. No.: WO2022/071222
PCT Pub. Date: Apr. 7, 2022

(65) Prior Publication Data
US 2023/0361782 A1    Nov. 9, 2023

(30) Foreign Application Priority Data

Sep. 30, 2020    (JP) .................................. 2020-165473

(51) Int. Cl.
*H03M 1/00*        (2006.01)
*H03M 1/12*        (2006.01)
(Continued)

(52) U.S. Cl.
CPC ......... *H03M 1/181* (2013.01); *H03M 1/1205* (2013.01); *H03M 1/34* (2013.01)

(58) Field of Classification Search
CPC ... G05F 1/575; G05F 1/59; G05F 1/56; G05F 1/563; G05F 1/565; G05F 1/595;
(Continued)

(56) References Cited

U.S. PATENT DOCUMENTS 7,619,402 B1 * 11/2009 Kwong .................. G05F 1/575
                                                          323/369
8,305,061 B1 * 11/2012 Zhang ................. H02M 3/1582
                                                          323/283
(Continued)

FOREIGN PATENT DOCUMENTS

| JP | 2013-225306 A | 10/2013 |
| JP | 2016-519356 A | 6/2016 |
| JP | 2020-516978 A | 6/2020 |

OTHER PUBLICATIONS

International Search Report and Written Opinion of PCT Application No. PCT/JP2021/035375, issued on Nov. 30, 2021, 08 pages of ISRWO.

*Primary Examiner* — Linh V Nguyen
(74) *Attorney, Agent, or Firm* — CHIP LAW GROUP

(57) ABSTRACT

Provided is a low voltage and compact digital control regulator that achieves enhanced stability and reduced variations in ripple voltage and droop characteristics. The digital control regulator includes a first A/D converter configured to generate a first digital signal according to a differential voltage between an output voltage and a first reference voltage, an output stage circuit configured to generate the output voltage, a replica circuit having the same circuit configuration as the output stage circuit and configured to output a replica voltage related to the output voltage, a second A/D converter configured to generate a second
(Continued)

digital signal according to a differential voltage between the replica voltage and a second reference voltage, and a control circuit configured to generate a control signal for controlling a gain of the output stage circuit, according to the first digital signal and the second digital signal.

21 Claims, 12 Drawing Sheets

(51) Int. Cl.
*H03M 1/18* (2006.01)
*H03M 1/34* (2006.01)

(58) Field of Classification Search
CPC . G05F 1/462; G05F 1/561; G05F 1/10; G05F 1/46; G05F 1/466; G05F 1/467; G05F 1/573; G05F 1/577; G05F 1/618; G05F 1/625; G05F 1/67; G05F 3/08; H03M 1/66; H03M 1/742; H03M 1/0863; H03M 1/12; H03M 1/002; H03M 1/0617; H03M 1/067; H03M 1/0673; H03M 1/08; H03M 1/1009; H03M 1/1061; H03M 1/462; H03M 1/662; H03M 1/664; H03M 1/68; H03M 1/687; H03M 1/785; H03M 1/808; H03M 3/30

USPC .................. 341/110, 118, 120, 144, 155
See application file for complete search history.

(56) References Cited

U.S. PATENT DOCUMENTS

| | | | |
|---|---|---|---|
| 8,541,995 B2* | 9/2013 | Tang | H02M 3/1584 |
| | | | 323/283 |
| 9,841,775 B2* | 12/2017 | Bingel | G05F 1/56 |
| 10,216,209 B1* | 2/2019 | Ham | G05F 1/575 |
| 11,853,090 B2* | 12/2023 | Lin | H02M 1/0029 |
| 11,899,479 B2* | 2/2024 | Ide | G05F 1/56 |
| 2022/0100218 A1* | 3/2022 | Jung | H02M 3/07 |
| 2022/0374035 A1* | 11/2022 | Gerber | G05F 1/575 |
| 2023/0168702 A1* | 6/2023 | Chen | G05F 1/575 |
| | | | 323/274 |
| 2023/0205243 A1* | 6/2023 | Gil | G05F 1/575 |
| | | | 323/273 |
| 2023/0288948 A1* | 9/2023 | Lee | G05F 1/563 |

* cited by examiner

DIGITAL CONTROL REGULATOR

CROSS REFERENCE TO RELATED APPLICATIONS

This application is a U.S. National Phase of International Patent Application No. PCT/JP2021/035375 filed on Sep. 27, 2021, which claims priority benefit of Japanese Patent Application No. JP 2020-165473 filed in the Japan Patent Office on Sep. 30, 2020. Each of the above-referenced applications is hereby incorporated herein by reference in its entirety.

TECHNICAL FIELD

The present disclosure relates to a digital control regulator.

BACKGROUND ART

In general, when the performance of the output stage circuit of a digital LDO (Low Drop Out) is too low, the current supply performance and the droop characteristics are deteriorated, while, when the performance is too high, the ripple voltage is increased, and the stability is deteriorated. It can thus be said that stability enhancement is in a trade-off relation with transient response characteristics enhancement and ripple reduction. When the performance of the output stage circuit can be kept constant, this problem can be solved.

Various control circuits configured to reduce variations in the performance of output stage circuits have hitherto been proposed (see PTL 1). As representative control circuits, (1) a multiloop control digital LDO implemented with a performance correction function, (2) a digital control performance correction circuit, and (3) an analog control performance correction circuit are given.

CITATION LIST

Patent Literature

[PTL 1]
National Publication of International Patent Application No. 2016-519356

SUMMARY

Technical Problems

The digital LDO of (1) described above has problems in that performance correction cannot be performed unless a change occurs in output, and that the stability is difficult to ensure due to multiloop control. Further, since a configuration is implemented with the analog voltage control loop, the configuration requires a large area, leading to increase in power.

The digital control performance correction circuit of (2) described above can perform neither adjustment according to an input voltage (or an input/output potential difference), adjustment taking into consideration transistor skew, nor temperature-based adjustment, thereby causing a risk of low correction accuracy.

The analog control performance correction circuit of (3) described above leads to increase in area and power and is thus not suitable for low voltage operation.

Accordingly, the present disclosure provides a low voltage and compact digital control regulator that achieves enhanced stability and reduced variations in ripple voltage and droop characteristics.

Solution to Problems

In order to solve the problems described above, according to the present disclosure, there is provided a digital control regulator including a first A/D converter configured to generate a first digital signal according to a differential voltage between an output voltage and a first reference voltage, an output stage circuit configured to generate the output voltage, a replica circuit having the same circuit configuration as the output stage circuit and configured to output a replica voltage related to the output voltage, a second A/D converter configured to generate a second digital signal according to a differential voltage between the replica voltage and a second reference voltage, and a control circuit configured to generate a control signal for controlling a gain of the output stage circuit, according to the first digital signal and the second digital signal.

The output stage circuit and the replica circuit may include circuits having the same circuit configuration and including transistors having the same conductivity type and the same size.

The output stage circuit and the replica circuit may include circuits having the same circuit configuration and including resistance elements having the same resistance value.

The second digital signal may include performance information regarding the replica circuit.

The control circuit may generate the control signal in such a manner that the output voltage is not affected by a fluctuation in performance information regarding the output stage circuit.

The performance information may include at least one piece of information regarding an input voltage, an output voltage, a manufacturing process, and a temperature of the replica circuit or the output stage circuit.

The second digital signal may include on-resistance information regarding the replica circuit.

The control circuit may generate, according to the second digital signal, the control signal for making on-resistance of the output stage circuit match on-resistance of the replica circuit.

The replica circuit may output the replica voltage before start of feedback control of the output voltage by the output stage circuit and the control circuit or in synchronization with a start timing of the feedback control, and the second A/D converter may generate the second digital signal before the start of the feedback control of the output voltage by the output stage circuit and the control circuit or in synchronization with the start timing of the feedback control.

The replica circuit may output the replica voltage in synchronization with a timing at which a voltage level of the output voltage has been switched during the feedback control of the output voltage by the output stage circuit and the control circuit, and the second A/D converter may generate the second digital signal in synchronization with the timing at which the voltage level of the output voltage has been switched during the feedback control of the output voltage by the output stage circuit and the control circuit.

The replica circuit may output the replica voltage a predetermined period before a timing at which a voltage level of the output voltage is switched during the feedback control of the output voltage by the output stage circuit and the control circuit, and the second A/D converter may generate the second digital signal at the timing at which the voltage level of the output voltage has been switched during the feedback control of the output voltage by the output stage circuit and the control circuit.

The replica circuit may intermittently output the replica voltage during feedback control of the output voltage by the output stage circuit and the control circuit, and the second A/D converter may intermittently generate the second digital signal during the feedback control of the output voltage by the output stage circuit and the control circuit.

The replica circuit may continuously output the replica voltage during feedback control of the output voltage by the output stage circuit and the control circuit, and the second A/D converter may continuously generate the second digital signal during the feedback control of the output voltage by the output stage circuit and the control circuit.

The replica circuit may output the replica voltage when an enable signal has a predetermined logic and stop outputting the replica voltage when the enable signal has a logic other than the predetermined logic.

The second reference voltage may be input to the second A/D converter at a timing at which the enable signal takes the predetermined logic.

The second A/D converter may includes a comparator configured to output a signal according to the differential voltage between the replica voltage and the second reference voltage, a variable load circuit configured to adjust a current flowing to an output node of the replica circuit, thereby controlling a voltage level of the replica voltage, and a control unit configured to, according to an output signal from the comparator, adjust a current flowing to the variable load circuit through the output node and generate the second digital signal including on-resistance information regarding the replica circuit for making the replica voltage match the second reference voltage.

The replica circuit may include a transistor or a resistance element, the number of connected stages of which is adjustable, and the second A/D converter may include a comparator configured to output a signal according to the differential voltage between the replica voltage and the second reference voltage, and a control unit configured to, according to an output signal from the comparator, adjust the number of connected stages of the transistor or the resistance element in the replica circuit and generate the second digital signal including on-resistance information regarding the replica circuit for making the replica voltage match the second reference voltage.

The output stage circuit may include a transistor or a resistance element, the number of connected stages of which is adjustable, and the control circuit may match, according to the second digital signal, the number of connected stages of the transistor or the resistance element in the output stage circuit with the number of connected stages of a transistor or a resistance element in the replica circuit.

The control circuit may perform feedback control to make the output voltage match the first reference voltage, and the first reference voltage and the second reference voltage may be at the same voltage level.

The control circuit may perform feedback control to make a voltage obtained by dividing the output voltage with a ratio of 1/A (A is a real number larger than 1) match the first reference voltage, the second reference voltage may be set to the same voltage level as the first reference voltage, and the second A/D converter may compare the replica voltage to a voltage obtained by multiplying the second reference voltage by A.

DESCRIPTION OF EMBODIMENT

Now, with reference to the drawings, a digital control regulator of an embodiment is described. Although the principal components of the digital control regulator are mainly described below, components or functions not illustrated or described may exist in the digital control regulator. The following description is not intended to exclude components or functions not illustrated or described.

Figure 1:
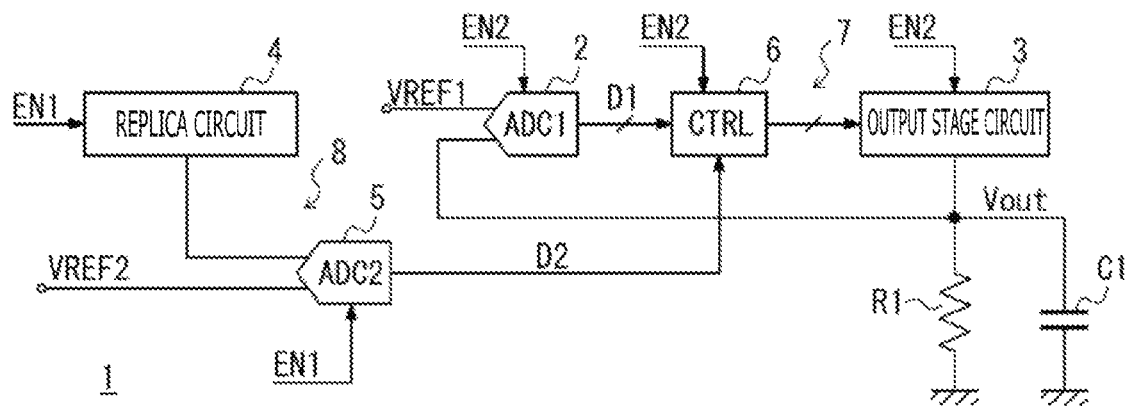
FIG. 1 is a block diagram of a digital control regulator according to an embodiment.

FIG. 1 is a block diagram of a digital control regulator 1 according to the embodiment. The digital control regulator 1 of FIG. 1 is also called a "digital control LDO." The digital control regulator 1 of FIG. 1 includes a first A/D converter (hereinafter referred to as an "ADC1" or a "first ADC") 2, an output stage circuit 3, a replica circuit 4, a second A/D converter (hereinafter referred to as an "ADC2" or a "second ADC") 5, and a control circuit (CTRL) 6.

The first ADC 2 generates a first digital signal D1 according to a differential voltage between an output voltage Vout and a first reference voltage VREF1. The first digital signal D1 is input to the control circuit 6. The first ADC 2 performs A/D conversion operation when receiving the first reference voltage VREF1 and the output voltage Vout.

The output stage circuit 3 generates the output voltage Vout. A resistance element R1 and a capacitor C1 are connected in parallel between the output node of the output stage circuit 3 and a ground node. The output stage circuit 3 is controlled by the control circuit 6. The output stage circuit 3, the first ADC 2, and the control circuit 6 form a digital LDO circuit 7. The digital LDO circuit 7 performs feedback control to make the output voltage Vout match the first reference voltage VREF1.

The replica circuit 4 has the same circuit configuration as the output stage circuit 3 and outputs a replica voltage related to the output voltage Vout. A replica voltage is at the same voltage level as the output voltage Vout when there is no load fluctuation. The replica circuit 4 and the second ADC 5 form a performance correction circuit 8 configured to correct the performance of the output stage circuit 3.

The replica circuit 4 may be enabled when a first enable signal EN1 has a predetermined logic, thereby outputting a replica voltage. In this case, the replica circuit 4 stops outputting a replica voltage when the first enable signal EN1 has a logic other than the predetermined logic, so that the power consumption of the replica circuit 4 can be reduced.

The second ADC 5 generates a second digital signal D2 according to a differential voltage between a replica voltage and a second reference voltage VREF2. The second digital signal D2 includes performance information regarding the replica circuit 4. Performance information regarding the replica circuit 4 includes at least one piece of information regarding, for example, the input voltage, the output voltage Vout, the manufacturing process, and the temperature of the replica circuit 4. Performance information regarding the replica circuit 4 is substantially the same as performance information regarding the output stage circuit 3. Further, the second digital signal D2 includes on-resistance information regarding the replica circuit 4. The second ADC 5 performs A/D conversion operation when receiving a replica voltage and the second reference voltage VREF2. The second ADC 5 is enabled when the first enable signal EN1 has a predetermined logic, thereby generating the second digital signal D2. The second reference voltage VREF2 is input to the second ADC 5 at the timing at which the first enable signal EN1 takes the predetermined logic. The period in which the second reference voltage VREF2 is input to the second ADC 5 is limited and the second ADC 5 is controlled to perform A/D conversion operation only when the first enable signal EN1 has the predetermined logic, so that the power consumption can be reduced.

The control circuit 6 generates a control signal for controlling the gain of the output stage circuit 3, on the basis of the first digital signal D1 and the second digital signal D2. The control circuit 6 generates a control signal for preventing the output voltage Vout from being fluctuated due to performance information regarding the output stage circuit 3. For example, the control circuit 6 generates a control signal for making the on-resistance of the output stage circuit 3 match the on-resistance of the replica circuit 4, on the basis of the second digital signal D2.

The output voltage Vout is fed back to the first ADC 2 to generate the first digital signal D1 according to a differential voltage between the output voltage Vout and the first reference voltage VREF1. The control circuit 6 generates a control signal for controlling the gain of the output stage circuit 3, on the basis of the first digital signal D1 and the second digital signal D2 from the second ADC 5. Since this feedback loop does not have a dual loop structure, a stability design can easily be made.

The on-resistance of the output stage circuit 3 is adjustable with a control signal output from the control circuit 6, and hence the output voltage Vout can be controlled by adjusting the on-resistance. The output stage circuit 3 has any concrete circuit configuration for adjusting its on-resistance. The output stage circuit 3 may output the output voltage Vout when a second enable signal EN2 has a predetermined logic. Further, the second enable signal EN2 may also be input to the first ADC 2 and the control circuit 6. In this case, the entire operation of the digital LDO circuit 7 including the first ADC 2, the control circuit 6, and the output stage circuit 3 can be stopped when the second enable signal EN2 has a logic other than the predetermined logic, so that the power consumption can be reduced.

The output stage circuit 3 and the replica circuit 4 are circuits having the same circuit configuration and including transistors having the same conductivity type and the same size, for example. Alternatively, the output stage circuit 3 and the replica circuit 4 may be circuits having the same circuit configuration and including resistance elements having the same resistance value.

As described later, the replica circuit 4 may output a replica voltage before the output stage circuit 3 and the control circuit 6 start the feedback control of the output voltage Vout or in synchronization with the start timing of feedback control. In this case, the second ADC 5 generates the second digital signal D2 before the output stage circuit 3 and the control circuit 6 start the feedback control of the output voltage Vout or in synchronization with the start timing of feedback control. In this way, the performance of the output stage circuit 3 is corrected before the start of digital LDO operation, so that digital LDO operation can be performed independently of variations in the performance of the output stage circuit 3.

Alternatively, the replica circuit 4 may output a replica voltage in synchronization with the timing at which the voltage level of the output voltage Vout has been switched during the feedback control of the output voltage Vout by the output stage circuit 3 and the control circuit 6. In this case, the second ADC 5 generates the second digital signal D2 in synchronization with the timing at which the voltage level of the output voltage Vout has been switched during the feedback control of the output voltage Vout by the output stage circuit 3 and the control circuit 6. When the voltage level of the output voltage Vout is changed, the droop characteristics and ripple characteristics of the output voltage Vout are fluctuated as described later. Accordingly, the performance of the output stage circuit 3 is corrected again at the timing at which the voltage level of the output voltage Vout has been changed, to thereby make it possible to enhance the droop characteristics, the ripple characteristics, and the like.

Alternatively, the replica circuit 4 may output a replica voltage a predetermined period before the timing at which the voltage level of the output voltage Vout is switched during the feedback control of the output voltage Vout by the output stage circuit 3 and the control circuit 6. In this case, the second ADC 5 generates the second digital signal D2 at the timing at which the voltage level of the output voltage Vout has been switched during the feedback control of the output voltage Vout by the output stage circuit 3 and the control circuit 6. To make it possible to correct the performance of the output stage circuit 3 at the timing at which the output voltage Vout has been switched, the second digital signal D2 including performance information regarding the replica circuit 4 needs to be output from the second ADC 5 before the timing at which the output voltage Vout is switched. With this, the performance of the output stage circuit 3 can be corrected from the timing at which the output voltage Vout has been switched.

Alternatively, the replica circuit 4 may intermittently output a replica voltage during the feedback control of the output voltage Vout by the output stage circuit 3 and the control circuit 6. In this case, the second ADC 5 intermittently generates the second digital signal D2 during the feedback control of the output voltage Vout by the output stage circuit 3 and the control circuit 6. When the performance of the output stage circuit 3 is intermittently corrected during digital LDO operation, even if the input voltage, the output voltage Vout, the temperature, or the like of the output stage circuit 3 is fluctuated, the output voltage Vout can be generated without being affected by the fluctuation.

Alternatively, the replica circuit 4 may continuously output a replica voltage during the feedback control of the output voltage Vout by the output stage circuit 3 and the control circuit 6. In this case, the second ADC 5 continuously generates the second digital signal D2 during the feedback control of the output voltage Vout by the output stage circuit 3 and the control circuit 6. When the performance of the output stage circuit 3 is continuously corrected during digital LDO operation, the output voltage Vout can be corrected in quick response to fluctuations in the input voltage, the output voltage Vout, the temperature, or the like of the output stage circuit 3.

The replica circuit 4 may output a replica voltage when the first enable signal EN1 has the predetermined logic and stop outputting a replica voltage when the first enable signal EN1 has a logic other than the predetermined logic. In this way, the replica circuit 4 is controlled to operate only when the replica circuit 4 is required, so that the power consumption of the replica circuit 4 can be reduced.

Further, the second ADC 5 performs A/D conversion operation only when the first enable signal EN1 has the predetermined logic. Further, the second reference voltage VREF2 is input to the second ADC 5 at the timing at which the first enable signal EN1 takes the predetermined logic. With this, the power consumption of the second ADC 5 can also be reduced.

Figure 2:
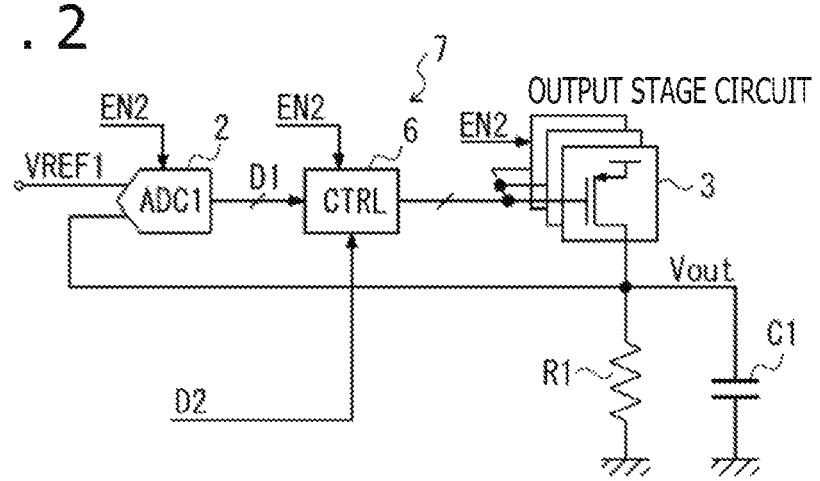
FIG. 2 is a block diagram illustrating an exemplary circuit configuration in an output stage circuit.

FIG. 2 is a block diagram illustrating an exemplary circuit configuration in the output stage circuit 3. As illustrated in FIG. 2, in the output stage circuit 3, for example, p-type MOS transistors (hereinafter simply referred to as a "transistor") are provided. The control circuit 6 outputs a control signal for controlling the number of transistors to be turned on in the output stage circuit 3. With a control signal, the number of transistors to be turned on is changed, and the on-resistance of the output stage circuit 3 is thus changed.

Figure 3A:
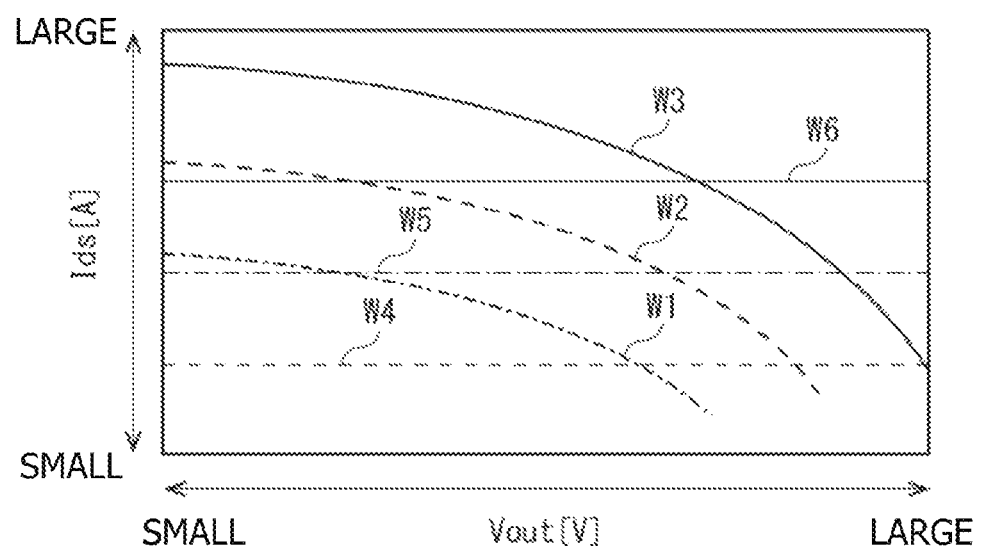
FIG. 3A is a diagram illustrating the characteristics of a transistor in the output stage circuit.

FIG. 3A is a diagram illustrating the characteristics of the transistor in the output stage circuit 3. In FIG. 3A, a horizontal axis indicates the output voltage Vout, and a vertical axis indicates the drain current of the transistor in the output stage circuit 3. Curves W1 to W3 of FIG. 3A indicate correspondences between the output voltage Vout and the drain current when a gate-source voltage Vgs of the transistor in the output stage circuit 3 has three different values (different power supply voltages). The curve W1 represents a characteristic curve in a case where Vgs=0.6 V holds, the curve W2 represents a characteristic curve in a case where Vgs=0.65 V holds, and the curve W3 represents a characteristic curve in a case where Vgs=0.7 V holds. As illustrated in FIG. 3A, the larger the gate-source voltage, the larger the drain current and the higher the performance of the transistor.

FIG. 3A illustrates three drain current straight lines W4 to W6 with current values different from each other. With regard to the order of the drain current magnitudes, W4<W5<W6 holds.

Figure 3B:
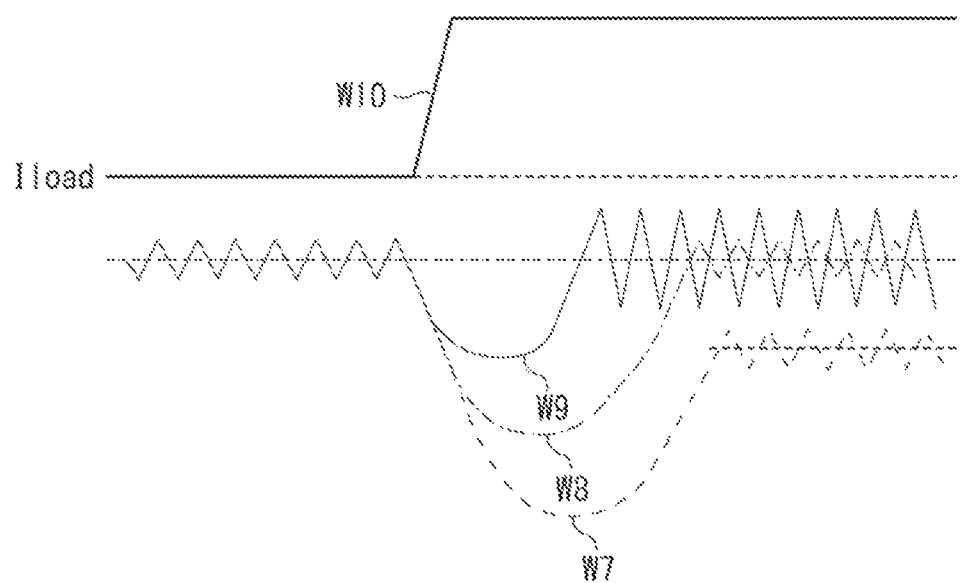
FIG. 3B is a diagram illustrating the amount of fluctuation in an output voltage due to a fluctuation in a load current.

FIG. 3B is a diagram illustrating the amount of fluctuation in the output voltage Vout due to a fluctuation in load current. Curves W7 to W9 of FIG. 3B correspond to the respective straight lines W4 to W6 of FIG. 3A. As illustrated in FIG. 3B, although the output voltage Vout is changed when the load current is fluctuated, the amount of fluctuation in the output voltage Vout due to the fluctuation in the load current is smaller with larger Vgs. How much the output voltage Vout is temporarily reduced when a load current is rapidly increased as in FIG. 3B is called droop characteristics. The smaller Vgs, the larger the amount of reduction in the output voltage Vout and the worse the droop characteristics.

As is clear in FIGS. 3A and 3B, as the performance of the transistor in the output stage circuit 3 is increased, while the droop characteristics are enhanced, the risks of less stable circuit operation, a larger ripple voltage, and lower noise characteristics are increased.

In the digital control regulator 1 illustrated in FIG. 1, the replica circuit 4 having the same circuit configuration as the output stage circuit 3 is provided, and the second digital signal D2 according to a differential voltage between a replica voltage output from the replica circuit 4 and the second reference voltage VREF2 is generated in the second ADC 5. The second digital signal D2 is a signal including performance information regarding the replica circuit 4. The control circuit 6 controls the gain of the output stage circuit 3 on the basis of the first digital signal D1 according to a differential voltage between the output voltage Vout and the first reference voltage VREF1 and the second digital signal D2. With this, the control circuit 6 can control the gain of the output stage circuit 3 by taking into consideration performance information regarding the output stage circuit 3, such as the input voltage, the output voltage Vout, the manufacturing process, and the temperature, with the result that the stability as well as the transient response and the ripple characteristics, which are originally in a trade-off relation with the stability, can all be enhanced.

Although the output stage circuit 3 and the replica circuit 4 of FIG. 1 have the same circuit configuration as described above, various modified examples are conceivable as the concrete circuit configurations of the output stage circuit 3 and the replica circuit 4.

Figure 4:
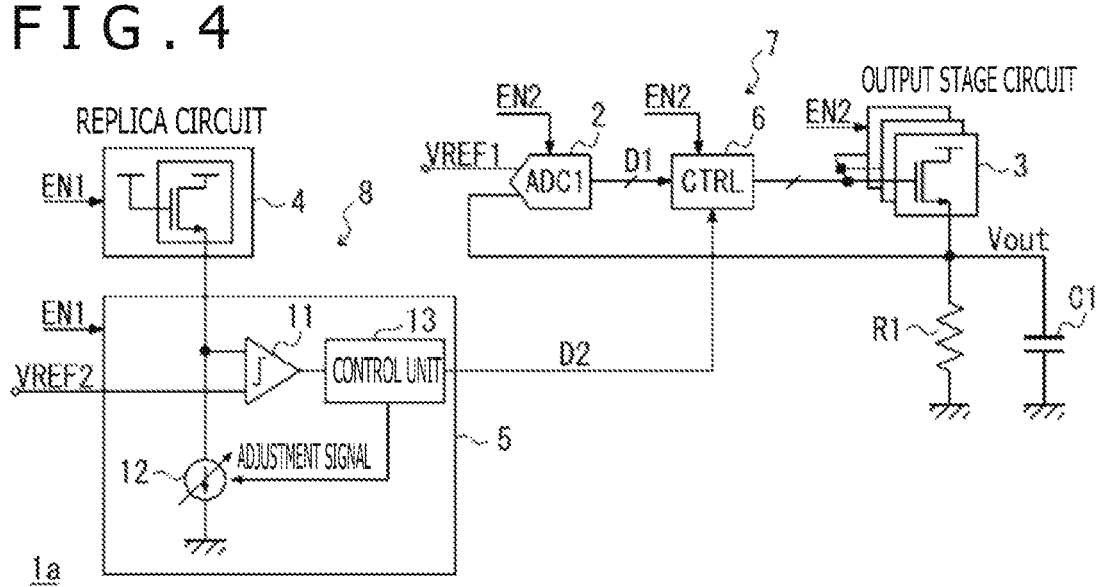
FIG. 4 is a block diagram illustrating a first concrete example of a digital control regulator.

FIG. 4 is a block diagram illustrating a first concrete example of a digital control regulator 1a. The output stage circuit 3 and the replica circuit 4 in the digital control regulator 1a of FIG. 4 include n-type MOS transistors (hereinafter referred to as a "transistor"). The output stage circuit 3 includes a plurality of transistors connected in parallel between a power supply voltage node and an output node, for example. Note that the output stage circuit 3 may include only one transistor. In the following, however, an example in which the output stage circuit 3 includes a plurality of transistors connected in parallel is described. A control signal is supplied from the control circuit 6 to the gates of the plurality of transistors in the output stage circuit 3. With the control signal, the on-resistance of the output stage circuit 3 is controlled.

The replica circuit 4 includes only one transistor that is the same as the transistors connected in parallel in the output stage circuit 3.

The replica circuit 4 outputs a replica voltage only when the first enable signal EN1 has a predetermined logic. Similarly, the output stage circuit 3 outputs the output voltage Vout only when the second enable signal EN2 has a predetermined logic. The first enable signal EN1 and the second enable signal EN2 are not necessarily essential. With the first enable signal EN1 and the second enable signal EN2, however, the power consumption of the performance correction circuit 8, which includes the replica circuit 4 and the second ADC 5, and the digital LDO circuit 7, which includes the first ADC 2, the control circuit 6, and the output stage circuit 3, can be reduced.

The second ADC 5 includes a comparator 11, a variable current source 12, and a control unit 13. The comparator 11 outputs a signal according to a differential voltage between a replica voltage and the second reference voltage VREF2. The variable current source 12 adjusts a current flowing to the output node of the replica circuit 4, to thereby control the voltage level of a replica voltage. The variable current source 12 is connected between the output node in the replica circuit 4 and a ground node. More specifically, the variable current source 12 is connected between the source of the transistor in the replica circuit 4 and the ground node.

On the basis of an output signal from the comparator 11, the control unit 13 adjusts a current flowing to the variable current source 12 through the output node and generates the second digital signal D2 including on-resistance information regarding the replica circuit 4 for making a replica voltage match the second reference voltage VREF2. More specifically, the control unit 13 generates an adjustment signal for adjusting a current to the variable current source 12, on the basis of a signal output from the comparator 11. For example, the control unit 13 generates an adjustment signal for reducing a current flowing through the variable current source 12 when a replica voltage is lower than the second reference voltage VREF2.

The control circuit 6 generates a control signal for controlling the gain of the output stage circuit 3, on the basis of the first digital signal D1 output from the first ADC 2 and the second digital signal D2 including on-resistance information regarding the replica circuit 4. With this control signal, the on-resistance of the output stage circuit 3 can be controlled.

The on-resistance of the output stage circuit 3 is changed, depending on performance information regarding the output stage circuit 3, such as the input voltage, the output voltage Vout, the manufacturing process, and the temperature, and the change in the on-resistance affects a drain current and the output voltage Vout. Accordingly, in the present embodiment, with the use of the replica circuit 4 having the same circuit configuration as the output stage circuit 3, on-resistance information regarding the replica circuit 4 is detected by the second ADC 5 to be supplied to the control circuit 6. With this, the control circuit 6 can control the on-resistance of the output stage circuit 3 by taking into consideration performance information regarding the output stage circuit 3 as a result.

Figure 5:
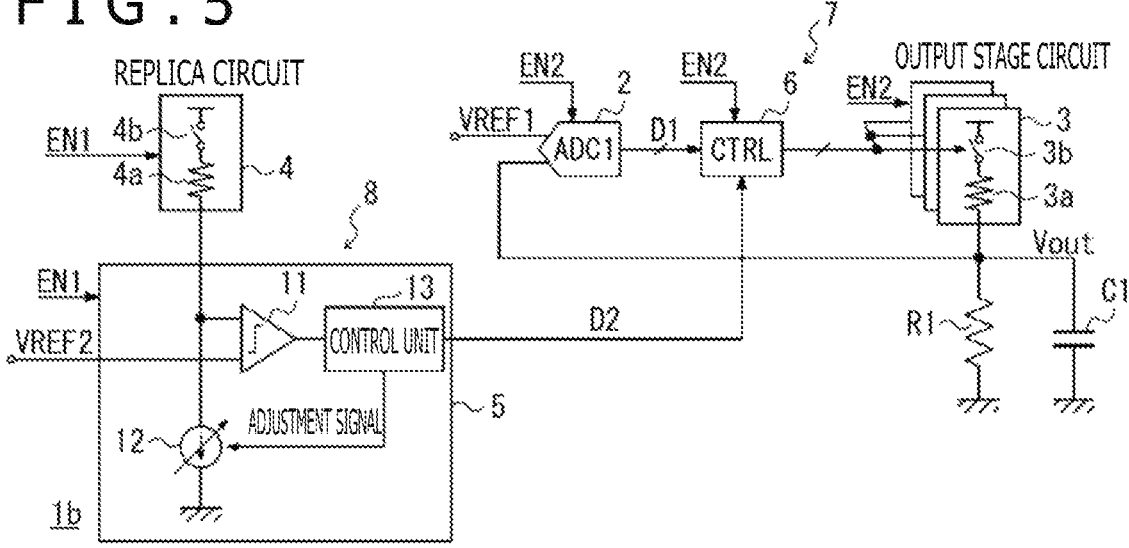
FIG. 5 is a block diagram illustrating a second concrete example of a digital control regulator.

FIG. 5 is a block diagram illustrating a second concrete example of a digital control regulator 1b. The output stage circuit 3 and the replica circuit 4 in the digital control regulator 1b of FIG. 5 include resistance elements. More specifically, the replica circuit 4 includes a resistance element 4a and a switch 4b connected in series between a power supply voltage node and an output node. The switch 4b is a component for switching whether to use the resistance element 4a or not. In the output stage circuit 3, multiple pairs of a resistance element 3a and a switch 3b connected in series are connected in parallel. Out of the multiple pairs, any pair of the resistance element 3a and the switch 3b can be selected. The replica circuit 4 includes the resistance element 4a and the switch 4b that are the same as those in the output stage circuit 3.

The second ADC 5 includes, as in FIG. 4, the comparator 11, the variable current source 12, and the control unit 13. The variable current source 12 is connected between the output node of the replica circuit 4 and a ground node. The control unit 13 performs operation similar to that of the control unit 13 of FIG. 4. That is, on the basis of an output signal from the comparator 11, the control unit 13 adjusts a current flowing to the variable current source 12 through the output node and generates the second digital signal D2 including on-resistance information regarding the replica circuit 4 for making a replica voltage match the second reference voltage VREF2.

Figure 6:
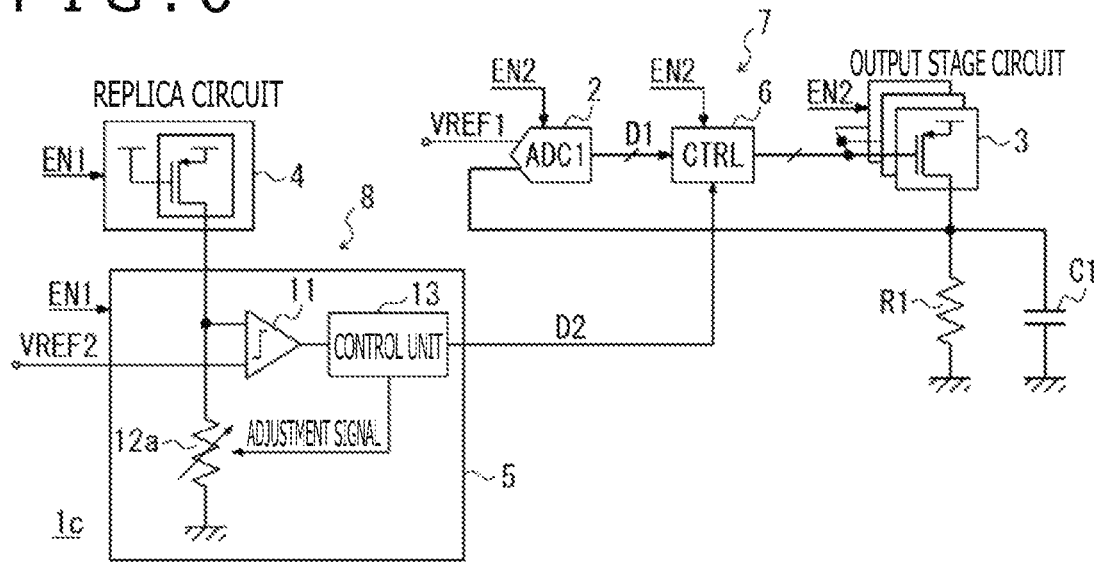
FIG. 6 is a block diagram illustrating a third concrete example of a digital control regulator.

FIG. 6 is a block diagram illustrating a third concrete example of a digital control regulator 1c. The output stage circuit 3 and the replica circuit 4 in the digital control regulator 1c of FIG. 6 include p-type MOS transistors. In this way, in the digital control regulator 1c of FIG. 6, as compared to the digital control regulator 1a of FIG. 4, the conductivity type of the transistors in the output stage circuit 3 and the replica circuit 4 is changed, and the logic of a control signal to be output from the control circuit 6 is accordingly inversed. The digital control regulators 1a and 1c perform, however, the same circuit operation. Further, the digital control regulator 1c of FIG. 6 includes a variable resistor 12a instead of the variable current source 12. The resistance value of the variable resistor 12a is adjusted with an adjustment signal from the control unit 13 to thereby control a replica voltage to be output from the replica circuit 4.

In any of the digital control regulators 1a, 1b, and 1c of FIG. 4 to FIG. 6, the control unit 13 in the second ADC 5 supplies the second digital signal D2 including on-resistance information regarding the replica circuit 4 to the control circuit 6. With this, the control circuit 6 can generate a control signal by taking into consideration the on-resistance information regarding the replica circuit 4.

FIG. 4 to FIG. 6 illustrate the examples in which the variable current source 12 is provided in the second ADC 5 and a current flowing through the variable current source 12 is controlled by the control unit 13 to make a replica voltage match the second reference voltage VREF2. However, a constant current source configured to supply a constant current may be provided instead of the variable current source 12, the number of connected stages of transistors or resistors in the output stage circuit 3 and the replica circuit 4 may be made changeable, and information regarding the number of connected stages may be included in the second digital signal D2 as on-resistance information to be supplied to the control circuit 6.

Figure 7:
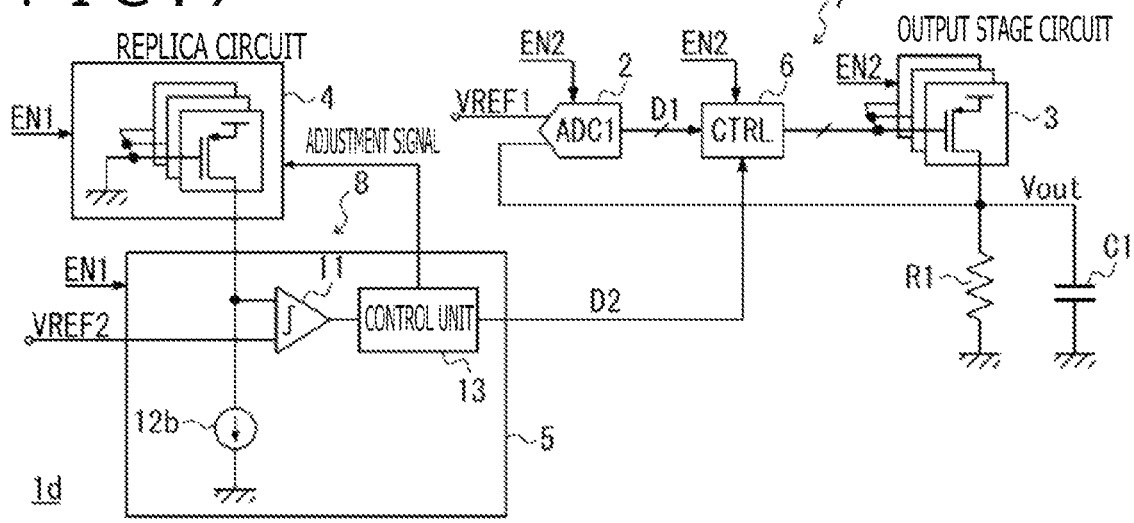
FIG. 7 is a block diagram illustrating a fourth concrete example of a digital control regulator.

FIG. 7 is a block diagram illustrating a fourth concrete example of a digital control regulator 1d. The output stage circuit 3 and the replica circuit 4 in the digital control regulator 1d of FIG. 7 each include a plurality of p-type MO transistors (hereinafter simply referred to as a "transistor"), the number of connected stages of which is changeable. Each transistor is connected between a power supply voltage node and an output node. The larger the number of connected stages of transistors in the output stage circuit 3 and the replica circuit 4, the smaller the on-resistance of the output stage circuit 3 and the replica circuit 4.

The second ADC 5 includes the comparator 11, a constant current source 12b, and the control unit 13. The comparator 11 outputs a signal according to a differential voltage between a replica voltage and the second reference voltage VREF2. The constant current source 12b is connected between the output node of the replica circuit 4 and a ground node and supplies a constant current. On the basis of an output signal from the comparator 11, the control unit 13 adjusts the number of connected stages of transistors in the replica circuit 4 and generates the second digital signal D2 including on-resistance information regarding the replica circuit 4 for making a replica voltage match the second reference voltage VREF2. More specifically, the control unit 13 generates an adjustment signal for making a replica voltage match the second reference voltage VREF2. This adjustment signal is supplied to the replica circuit 4. The replica circuit 4 adjusts, on the basis of an adjustment signal, the number of connected stages of transistors in the replica circuit 4. Each transistor in the replica circuit 4 is always on, and the replica circuit 4 adjusts the number of connected stages of turned-on transistors with an adjustment signal. For example, in a case where a replica voltage is lower than the second reference voltage VREF2, the control unit 13 increases the number of connected stages of transistors in the replica circuit 4. With this, the on-resistance of the replica circuit 4 is reduced, and the replica voltage is increased.

The on-resistance of the replica circuit 4 is changed depending on the number of connected stages of transistors in the replica circuit 4. The control unit 13 supplies the second digital signal D2 including on-resistance information regarding the replica circuit 4 to the control circuit 6. On the basis of the first digital signal D1 and the second digital signal D2, the control circuit 6 generates a control signal and controls the number of connected stages of transistors in the output stage circuit 3.

Figure 8:
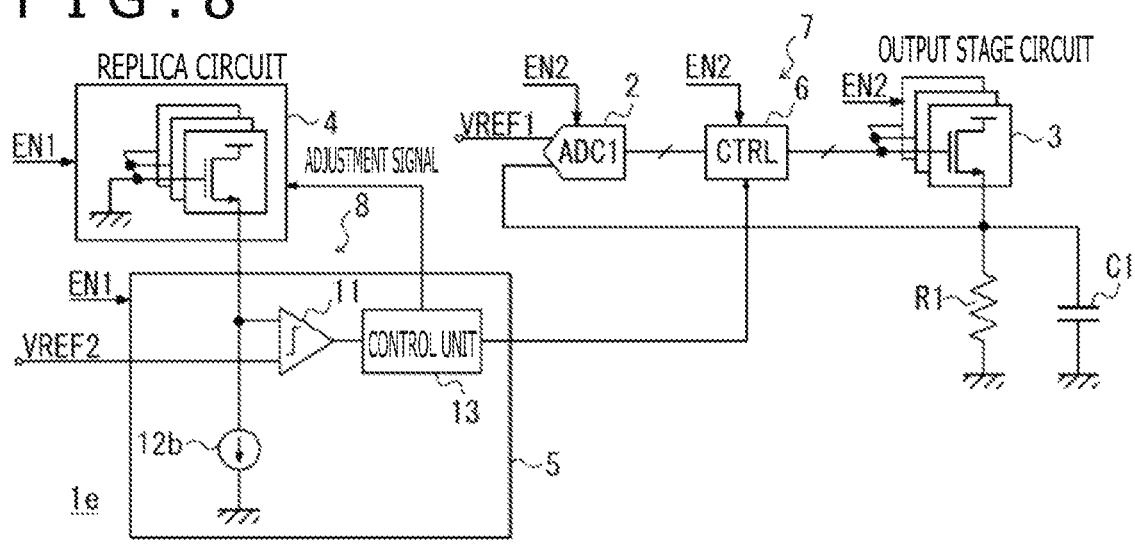
FIG. 8 is a block diagram illustrating a fifth concrete example of a digital control regulator.

FIG. 8 is a block diagram illustrating a fifth concrete example of a digital control regulator 1. The output stage circuit 3 and the replica circuit 4 in the digital control regulator 1 of FIG. 8 each include a plurality of n-type MOS transistors (hereinafter simply referred to as a "transistor"), the number of connected stages of which is changeable. That is, as compared to FIG. 7, in the digital control regulator 1 of FIG. 8, the conductivity type of the transistors in the output stage circuit 3 and the replica circuit 4 is different and the logic of a control signal to be output from the control circuit 6 is accordingly changed.

Also in the digital control regulator 1 of FIG. 8, the control unit 13 in the second ADC 5 supplies the second digital signal D2 including on-resistance information regarding the replica circuit 4 to the control circuit 6. The control circuit 6 controls the number of connected stages of transistors in the output stage circuit 3 on the basis of the first digital signal D1 and the second digital signal D2.

Figure 9:
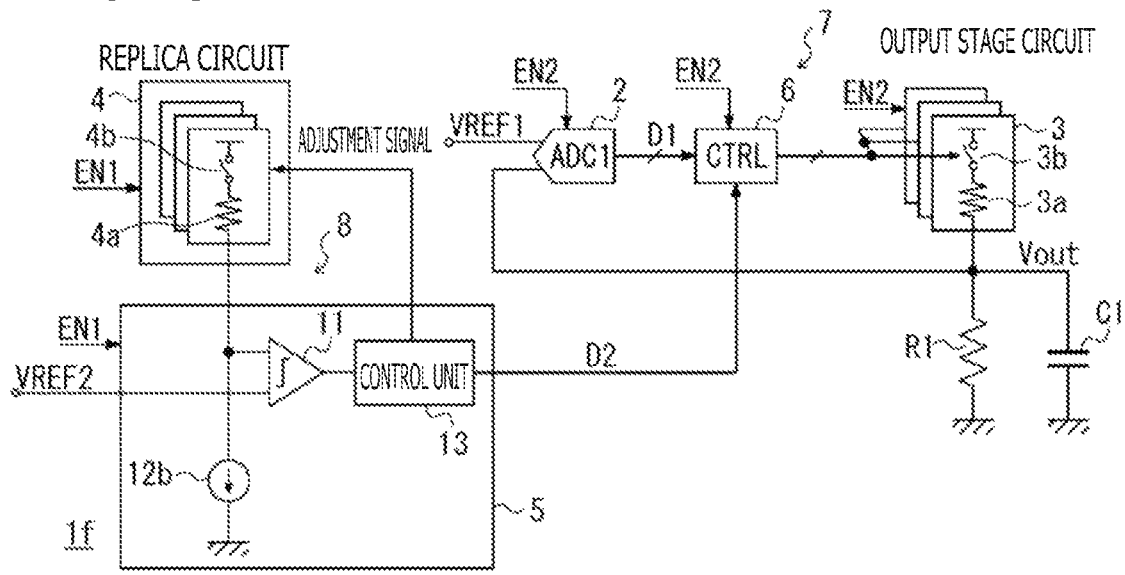
FIG. 9 is a block diagram illustrating a sixth concrete example of a digital control regulator.

FIG. 9 is a block diagram illustrating a sixth concrete example of a digital control regulator 1f. The digital control regulator 1f of FIG. 9 includes, in the output stage circuit 3 and the replica circuit 4, a plurality of resistor circuits, the number of connected stages of which is changeable. Each resistor circuit includes the resistance element 3a or 4a and the switch 3b or 4b connected in series between a power supply voltage node and an output node. By turning on the switch 3b or 4b, the resistance element 3a or 4a connected to the switch 3b or 4b can be selected. By turning on or off the switch 3b or 4b of each resistor circuit, the number of resistance elements 3a or 4a to be connected in parallel between the power supply voltage node and the output node can be controlled. As the number of resistance elements connected in parallel in the replica circuit 4 is increased, the on-resistance of the replica circuit 4 can be reduced. Also in the digital control regulator 1f of FIG. 9, the control unit 13 in the second ADC 5 supplies the second digital signal D2 including on-resistance information regarding the replica circuit 4 to the control circuit 6.

Figure 10:
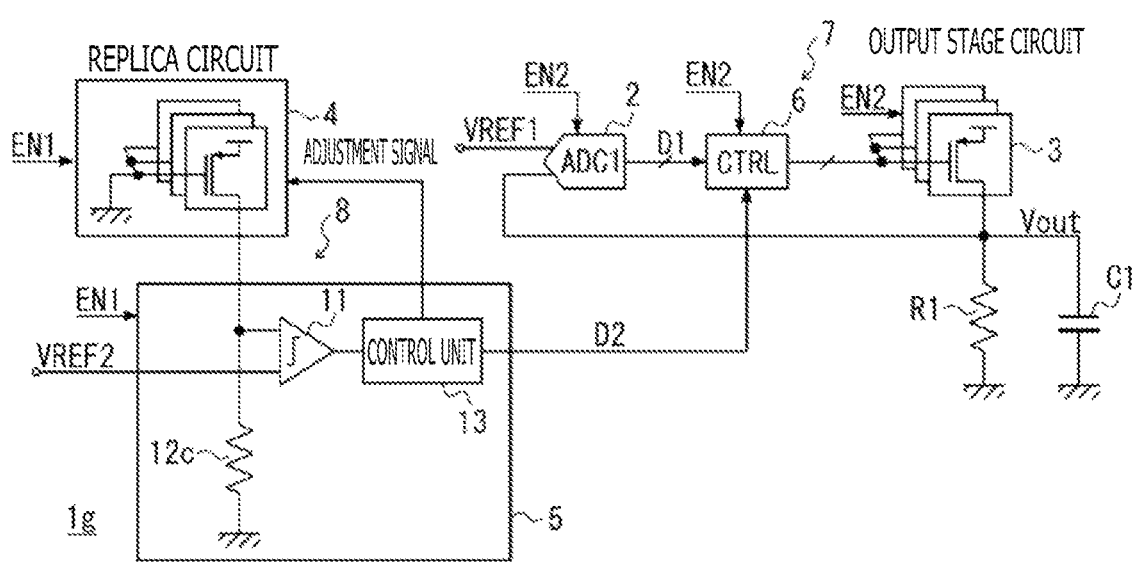
FIG. 10 is a block diagram illustrating a seventh concrete example of a digital control regulator.

FIG. 10 is a block diagram illustrating a seventh concrete example of a digital control regulator 1g. The digital control regulator $1_g$ of FIG. 10 has the same circuit configuration as the digital control regulator 1d of FIG. 7 except that the constant current source in the digital control regulator 1d of FIG. 7 is replaced with a resistance element.

In each of the digital control regulators 1d, 1e, 1f, and 1g of FIG. 7 to FIG. 10, like the digital control regulators 1a, 1b, and 1c of FIG. 4 to FIG. 6, the second ADC 5 supplies the second digital signal D2 including on-resistance information regarding the replica circuit 4 to the control circuit 6. The control circuit 6 generates a control signal for controlling the gain of the output stage circuit 3, on the basis of the first digital signal D1 and the second digital signal D2. With this, the output voltage Vout can be controlled by taking into consideration performance information regarding the output stage circuit 3.

The replica circuit 4 and the second ADC 5 in each of the digital control regulators 1, 1a, 1b, 1c, 1d, 1e, 1f, and 1g of FIG. 1 and FIG. 4 to FIG. 10 described above form the performance correction circuit 8 configured to correct the performance of the output stage circuit 3. Meanwhile, the output stage circuit 3, the first ADC 2, and the control circuit 6 form the digital LDO circuit. The digital LDO circuit performs feedback control by the first ADC 2 and the control circuit 6 to make the output voltage Vout match the first reference voltage VREF1. The performance correction circuit 8 generates performance information regarding the replica circuit 4. The control circuit 6 generates a control signal by taking into consideration not only the first digital signal D1 but also the second digital signal D2 output from the second ADC 5. With this, the performance of the output stage circuit 3 can be corrected.

Figure 11:
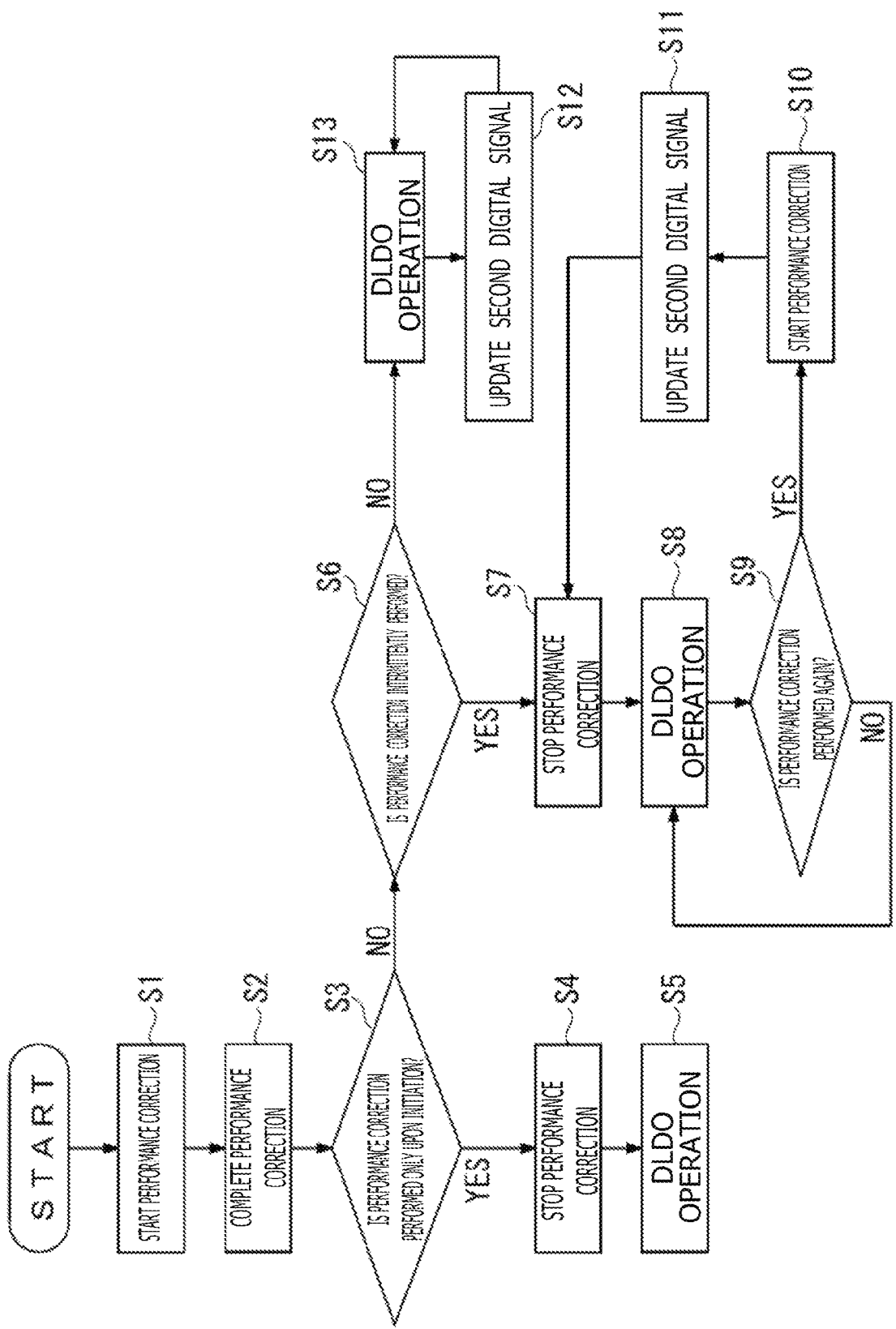
FIG. 11 is a flowchart illustrating an exemplary processing procedure including digital LDO operation and the correction of the performance of the output stage circuit.

As the timing at which the performance correction circuit 8 performs performance correction, a plurality of timings is conceivable. FIG. 11 is a flowchart illustrating an exemplary processing procedure including digital LDO operation and the correction of the performance of the output stage circuit 3. FIG. 11 illustrates the processing procedure that is performed by the digital control regulator 1, 1a, 1b, 1c, 1d, 1e, 1f, or 1g of any one of FIG. 1 and FIG. 4 to FIG. 10.

First, before the start of digital LDO operation, performance correction is performed (Step S1). When the performance correction ends (Step S2), it is determined whether or not to perform performance correction only upon the initiation of digital LDO operation (Step S3). In a case where it is determined that performance correction is performed only upon initiation, the performance correction circuit 8 including the replica circuit 4 and the second ADC 5 is controlled to stop operating (Step S4), and digital LDO operation starts (Step S5). In Step S4, for example, the replica circuit 4 is disabled to prevent the replica circuit 4 from outputting a replica voltage. Alternatively, the supply of a power supply voltage to the replica circuit 4 and the second ADC 5 may be cut. With this, the power consumption of the replica circuit 4 and the second ADC 5 can be reduced.

Next, in a case where NO is determined in Step S3, it is determined whether or not to intermittently perform performance correction (Step S6). When it is determined in Step S6 to intermittently perform performance correction, the performance correction circuit 8 is controlled to stop operating (Step S7), and digital LDO operation starts (Step S8). After that, it is determined whether or not the timing at which intermittent performance correction is performed comes again (Step S9), and when the timing at which performance correction comes, the performance correction circuit 8 is controlled to operate (Step S10) to output the second digital signal D2 from the second ADC 5 (Step S11). In this way, in Step S11, the second digital signal D2 is updated every time intermittent performance correction is performed. When the processing in Step S11 ends, the processing in Step S7 and thereafter is repeated. In a case where NO is determined in Step S6, performance correction is continuously performed during digital LDO operation (Steps S12 and S13).

Figure 12:
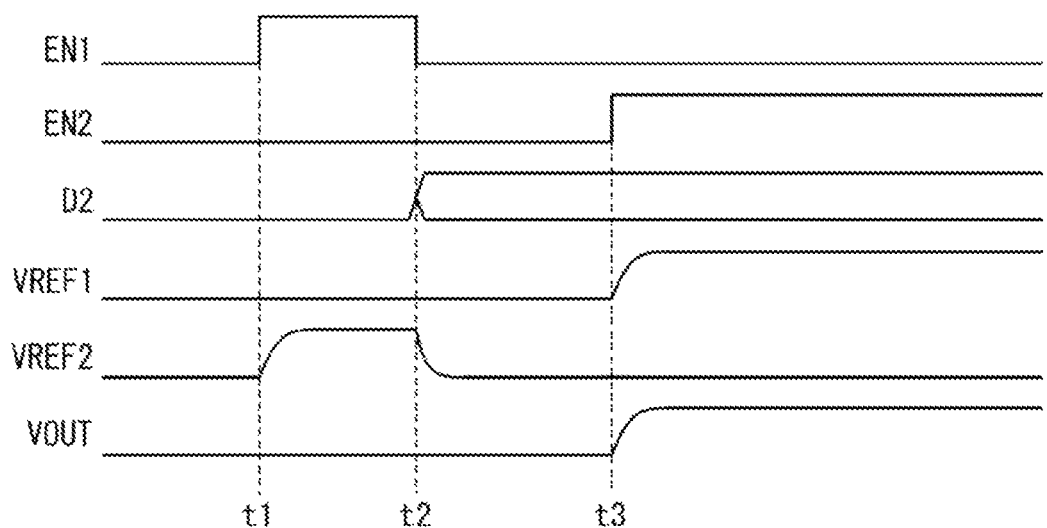
FIG. 12 is a timing chart in a case where performance correction is performed only upon initiation.

FIG. 12 is a timing chart in a case where YES is determined in Step S3 of FIG. 11, that is, performance correction is performed only upon initiation. FIG. 12 illustrates the respective signal waveforms of the first enable signal EN1 for the performance correction circuit 8 including the replica circuit 4 and the second ADC 5, the second enable signal EN2 for the digital LDO circuit 7 including the first ADC 2, the control unit 13 circuit, and the output stage circuit 3, the second digital signal D2, the first reference voltage VREF1, the second reference voltage VREF2, and the output voltage Vout.

The period from a time t1 to a time t3 of FIG. 12 is a period before the start of digital LDO operation, and the first enable signal EN1 to be input to the replica circuit 4 is set high in the period from the time t1 to the time t2. With this, between the time t1 to the time t2, the performance correction circuit 8 including the replica circuit 4 and the second ADC 5 performs performance correction processing. Specifically, the second reference voltage VREF2 is input to the second ADC 5 in the period from the time t1 to the time t2. The second ADC 5 outputs the second digital signal D2 including on-resistance information regarding the replica circuit 4 at the time t2. The replica circuit 4 is disabled at the time t2, so that the second reference voltage VREF2 is not input to the second ADC 5 thereafter, and the second ADC 5 holds the second digital signal D2 output at the time t2.

After that, in the period from the time t3, the first reference voltage VREF1 is input to the first ADC 2 to perform digital LDO operation. At this time, the control circuit 6 generates a control signal on the basis of the first digital signal D1 and the second digital signal D2. This control signal is a signal taking into account the digital LDO operation and the correction of the performance of the output stage circuit 3. With this, the output stage circuit 3 outputs the output voltage Vout based on the corrected performance of the output stage circuit 3.

The timing at which the performance correction circuit 8 including the replica circuit 4 and the second ADC 5 performs performance correction may not be before the start of digital LDO operation but be the timing of the start of digital LDO operation.

Figure 13:
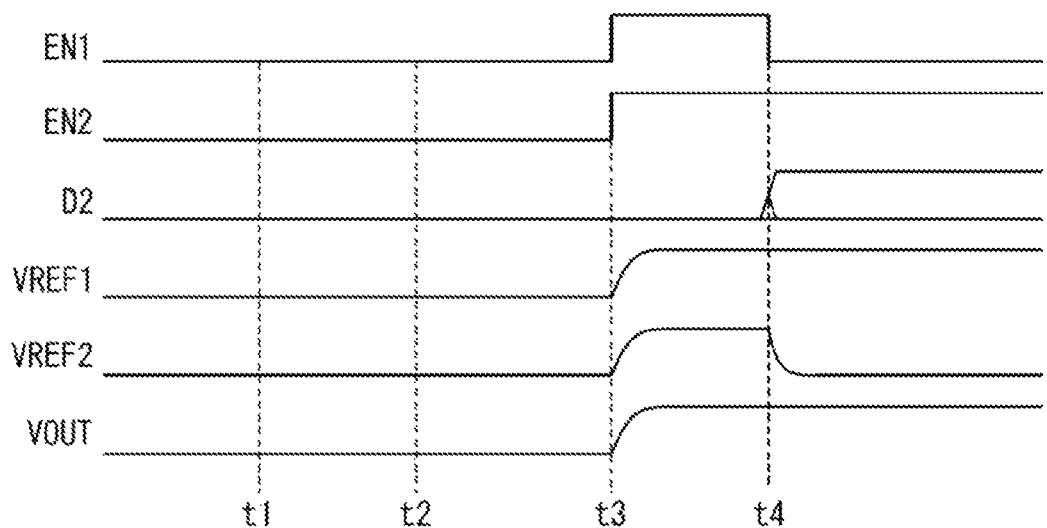
FIG. 13 is a timing chart when a performance correction circuit performs performance correction upon the start of digital LDO operation.

FIG. 13 is a timing chart when the performance correction circuit 8 performs performance correction upon the start of digital LDO operation. In the period from the time t3 to a time t4 of FIG. 13, the first enable signal EN1 for the replica circuit 4 is set high, and the second reference voltage VREF2 is input to the second ADC 5. Thus, the output voltage Vout after digital LDO operation is output at the time t3 and thereafter. Further, the second ADC 5 outputs the second digital signal D2 including on-resistance information regarding the replica circuit 4 at the time t4. At the time t4 and thereafter, a control signal taking into account the correction of the performance of the output stage circuit 3 is output from the control unit 13. Thus, the output stage circuit 3 outputs the output voltage Vout based on the corrected performance of the output stage circuit 3 at the time t4 and thereafter.

Figure 14:
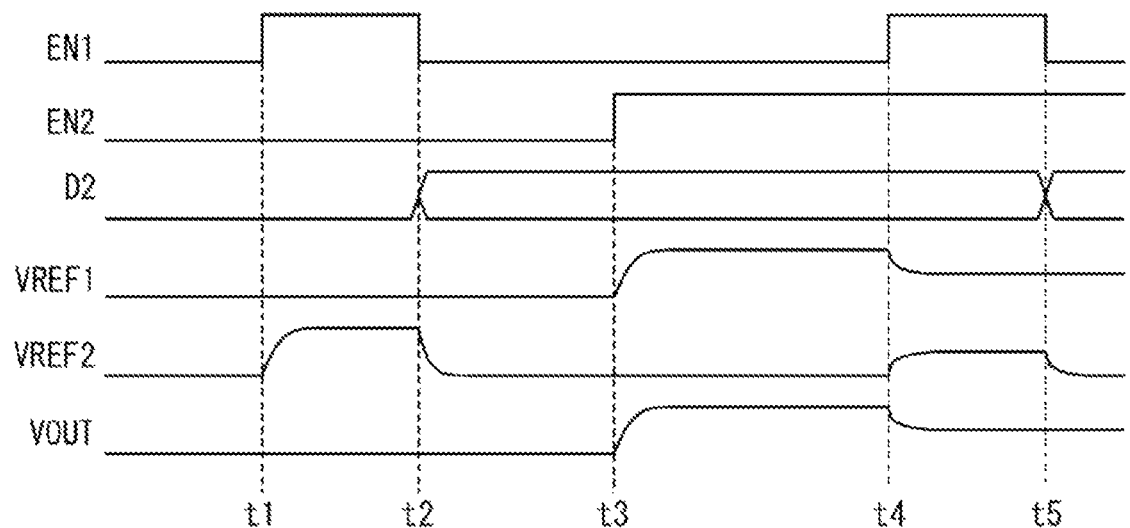
FIG. 14 is a timing chart in a case where performance correction is intermittently performed.

The digital control regulators 1 to 1g described above may intermittently perform performance correction by the performance correction circuit 8. FIG. 14 is a timing chart in a case where performance correction is intermittently performed. The performance correction circuit 8 corrects the performance of the output stage circuit 3 in the period from the time t1 to the time t2, which is the period before the initiation of digital LDO operation, and the period from the time t4 to a time t5, which is the period after the initiation of digital LDO operation. Although not illustrated in FIG. 14, the performance correction circuit 8 also intermittently performs performance correction in digital LDO operation periods including the time t5 and thereafter.

FIG. 14 illustrates the example in which the output stage circuit 3 switches the voltage level of the output voltage Vout at the time t4, and the performance correction circuit 8 performs performance correction at the timing at which the voltage level of the output voltage Vout is switched. This is because, when the output voltage Vout of the output stage circuit 3 is changed, the droop characteristics, the ripple characteristics, and the like are changed.

In a case where the voltage level of the output voltage Vout is changed at the time t4 of FIG. 14, the first enable signal EN1 for the replica circuit 4 is set high in the period from the time t4 to the time t5, so that the replica circuit 4 is enabled. Further, the second reference voltage VREF2 is input to the second ADC 5 in the period from the time t4 to the time t5. The second ADC 5 outputs the second digital signal D2 including performance information regarding the replica circuit 4 at the time t5, and the output stage circuit 3 outputs the output voltage Vout taking into account the correction of the performance of the output stage circuit 3 at the time t5 and thereafter.

In a case where performance correction is intermittently performed, performance correction may be performed at constant time intervals, or after the start of digital LDO operation, performance correction may be performed only in a case where the voltage level of the output voltage Vout of the output stage circuit 3 is changed, as in the time t4 of FIG. 14.

Figure 15:
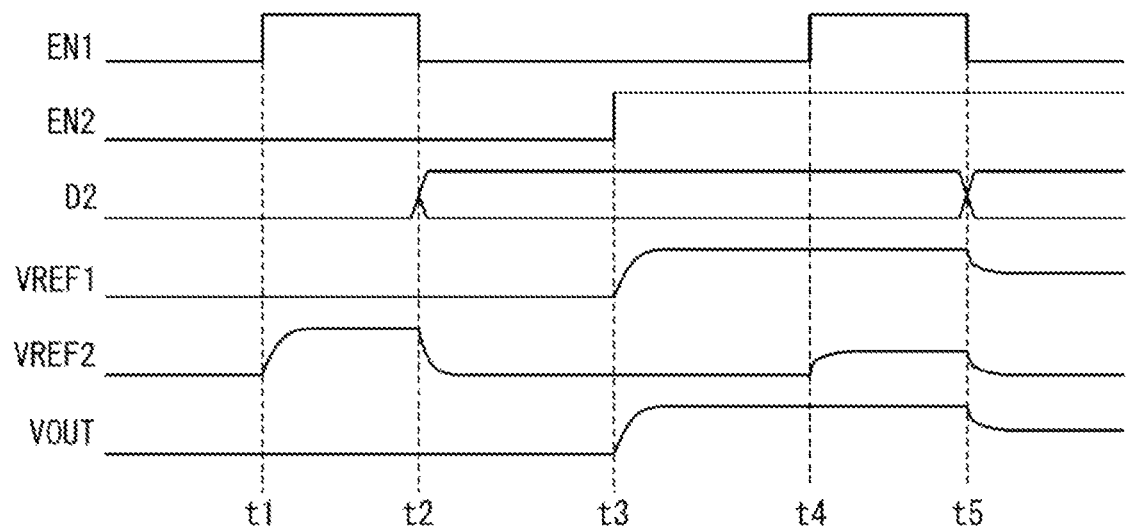
FIG. 15 is a timing chart when performance correction is performed before the voltage level of an output voltage is switched.

Although performance correction is performed when the voltage level of the output voltage Vout is switched in FIG. 14, as illustrated in the timing chart of FIG. 15, performance correction may be performed prior to the timing at which the voltage level of the output voltage Vout is switched. FIG. 15 illustrates an example in which performance correction is performed in the period from the time t1 to the time t2, which is before the disclosure of digital LDO operation, and performance correction is performed in the period from the time t4 to the time t5, which is just before the time t5 at which the voltage level of the output voltage Vout is switched after the start of digital LDO operation. Since the digital control regulators 1 to 1g grasp the timing at which the voltage level of the output voltage Vout is switched, the digital control regulators 1 to 1g can also perform performance correction in the period from the time t4 to the time t5 just before the switching of the voltage level of the output voltage Vout. With this, at the time t5, the second digital signal D2 including performance information regarding the replica circuit 4 can be output from the second ADC 5. Thus, at the time t5, at which the voltage level of the output voltage Vout is switched, and thereafter, the output voltage Vout based on the corrected performance of the output stage circuit 3 can be output. That is, when the voltage level of the output voltage Vout is switched, the output voltage Vout based on corrected performance can be output from the time point of switching.

Figure 16:
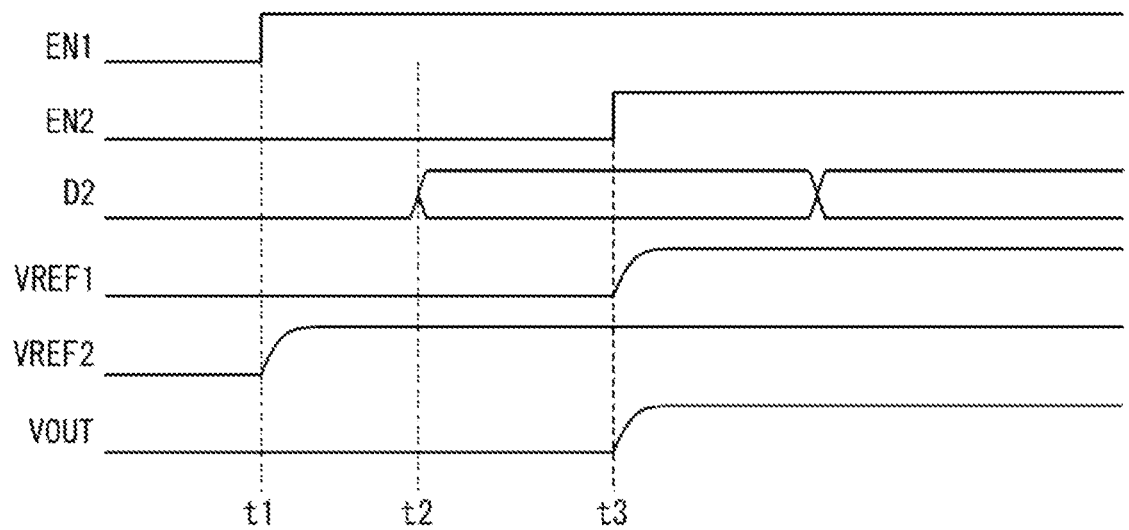
FIG. 16 is a timing chart in a case where performance correction is continuously performed before the start of digital LDO operation.
Figure 17:
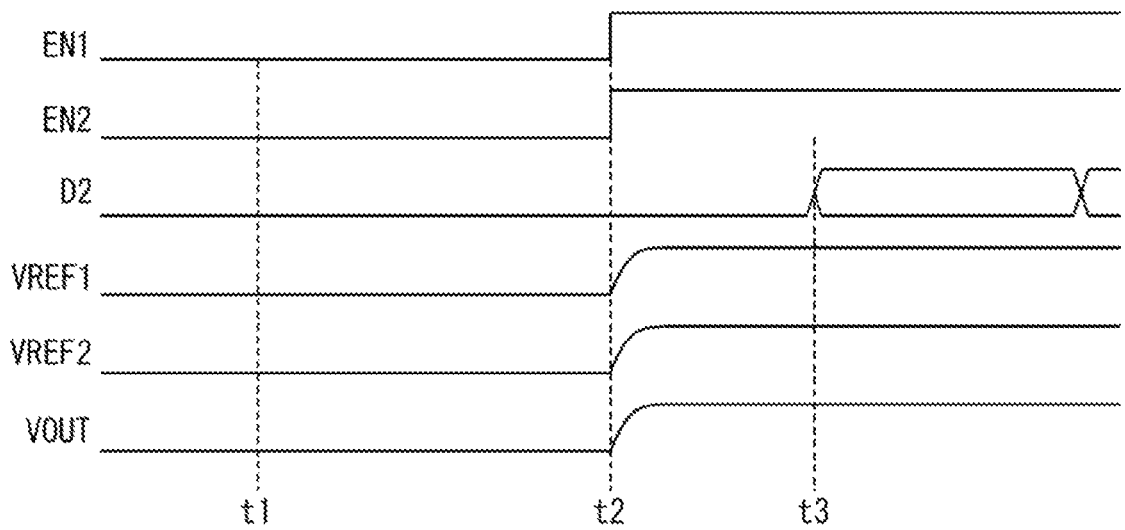
FIG. 17 is a diagram illustrating an example in which performance correction is continuously performed at the timing of the start of digital LDO operation.

The digital control regulators 1 to 1g described above may continuously perform performance correction by the performance correction circuit 8. FIG. 16 and FIG. 17 are timing charts in a case where performance correction is continuously performed. The timing chart of FIG. 16 illustrates a case where performance correction is continuously performed before the start of digital LDO operation. Further, FIG. 17 illustrates an example in which performance correction is continuously performed at the timing of the start of digital LDO operation.

At the time t1 of FIG. 16, the first enable signal EN1 to be input to the replica circuit 4 is set high, so that the replica circuit 4 is enabled. The first enable signal EN1 is kept at the high level at the time t1 and thereafter. Further, the second reference voltage VREF2 is continuously input to the second ADC 5 at the time t1 and thereafter. When the time t2 comes, the second ADC 5 outputs the second digital signal D2 including performance information regarding the replica circuit 4. Since the second ADC 5 continues operating at the time t2 and thereafter, the second digital signal D2 is kept up to date depending on performance information regarding the replica circuit 4. When the time t3 comes, the second enable signal EN2 to be input to the output stage circuit 3 is set high, so that the output stage circuit 3 is enabled. Further, at the time t3 and thereafter, the first reference voltage VREF1 is continuously input to the first ADC 2. The control circuit 6 generates a control signal on the basis of the first digital signal D1 output from the first ADC 2 and the second digital signal D2 output from the second ADC 5. The output stage circuit 3 outputs, on the basis of the control signal, the output voltage Vout taking into account the correction of the performance of the output stage circuit 3 at the time t3 and thereafter.

In FIG. 17, at the time t2, the first enable signal EN1 to be input to the replica circuit 4 and the second enable signal EN2 to be input to the output stage circuit 3 are both set high, so that the replica circuit 4 and the output stage circuit 3 are continuously in the enabled state at the time t2 and thereafter. Further, at the time t2, the first reference voltage VREF1 is input to the first ADC 2, and the second reference voltage VREF2 is input to the second ADC 5. The first reference voltage VREF1 and the second reference voltage VREF2 are continuously input to the first ADC 2 and the second ADC 5, respectively, at the time t2 and thereafter. The second ADC 5 outputs the second digital signal D2 including on-resistance information regarding the replica circuit 4 at the time t3 and thereafter. The second digital signal D2 is continuously updated on the basis of the latest on-resistance information regarding the replica circuit 4 at the time t3 and thereafter. The output stage circuit 3 continuously outputs the output voltage Vout taking into account the correction of the performance of the output stage circuit 3 at the time t3 and thereafter.

The output voltage Vout to be output from the output stage circuit 3, the first reference voltage VREF1 to be input to the first ADC 2, and the second reference voltage VREF2 to be input to the second ADC 5 have respective relevant voltage levels.

Figure 18:
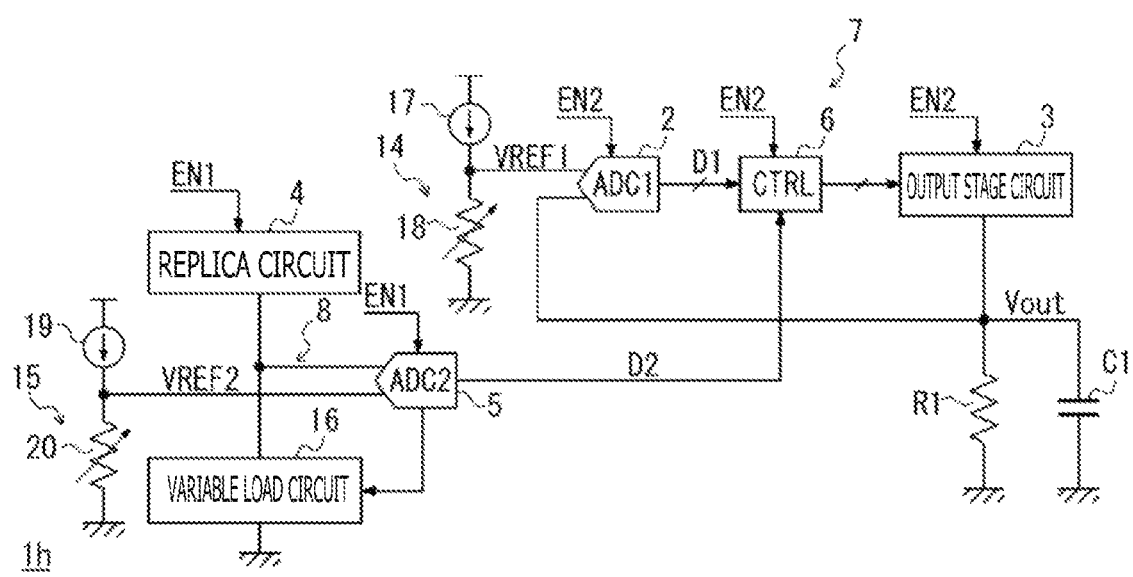
FIG. 18 is a block diagram illustrating an exemplary schematic configuration of a digital control regulator according to the present embodiment.

FIG. 18 is a block diagram illustrating an exemplary schematic configuration of a digital control regulator 1h according to the present embodiment. The digital control regulator 1h of FIG. 18 has a configuration that is more specific than that of the digital control regulator 1 of FIG. 1. In FIG. 18, components common to those of FIG. 1 are denoted by the same reference signs, and the differences are mainly described below.

The digital control regulator 1h of FIG. 18 includes, in addition to the configuration of FIG. 1, a first reference voltage generation circuit 14 configured to generate the first reference voltage VREF1, a second reference voltage generation circuit 15 configured to generate the second reference voltage VREF2, and a variable load circuit 16.

The first reference voltage generation circuit 14 includes a first current source 17 and a first variable resistor 18 connected in series between a power supply voltage node and a ground node. The second reference voltage generation circuit 15 includes a second current source 19 and a second variable resistor 20 connected in series between the power supply voltage node and the ground node.

The variable load circuit 16 is connected between the output node of the replica circuit 4 and the ground node and has a resistance value that is variably controlled with an adjustment signal from the second ADC 5. A concrete example of the variable load circuit 16 is the variable current source 12 or the variable resistor illustrated in FIG. 4, FIG. 5, or FIG. 6.

In the digital control regulator 1h of FIG. 18, the control circuit 6 performs feedback control to make the output voltage Vout match the first reference voltage VREF1. In this case, the second reference voltage VREF2 to be input to the second ADC 5 is set to the same voltage level as the first reference voltage VREF1. Thus, in the digital control regulator 1h of FIG. 18, in the stable state, output voltage Vout=first reference voltage VREF1=second reference voltage VREF2 holds.

In a case where the voltage level of the output voltage Vout is high, when the first reference voltage VREF1 and the second reference voltage VREF2 are set to the same voltage level as the output voltage Vout, the power consumption is large. Accordingly, a circuit-based solution for making the first reference voltage VREF1 and the second reference voltage VREF2 have a voltage level lower than that of the output voltage Vout may be made.

Figure 19:
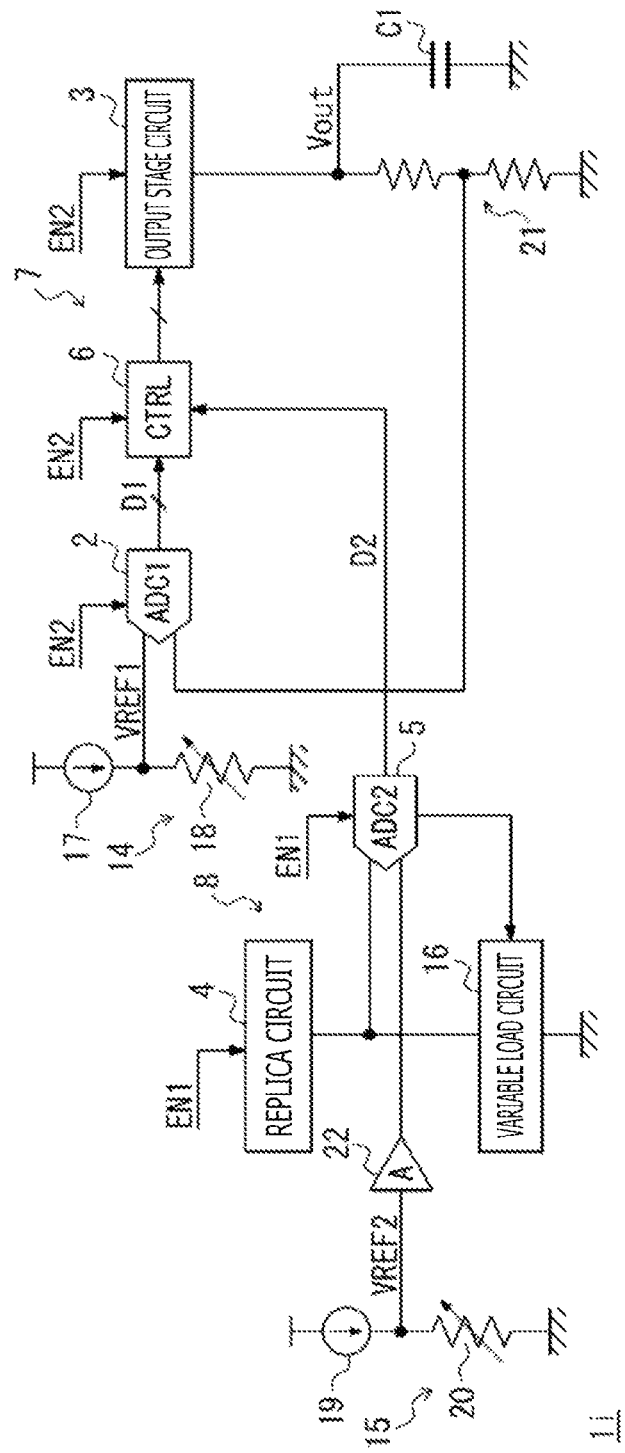
FIG. 19 is a block diagram of a digital control regulator according to a modified example.

FIG. 19 is a block diagram of a digital control regulator 1i according to a modified example. FIG. 19 includes, in addition to the circuit configuration of FIG. 18, a voltage divider resistor circuit 21 and a voltage amplifier 22. The voltage divider resistor circuit 21 is connected between the output node of the output stage circuit 3 and a ground node and divides the output voltage Vout. A divided voltage obtained through voltage division by the voltage divider resistor circuit 21 is input to the first ADC 2. The voltage divider resistor circuit 21 multiplies the output voltage Vout by 1/A to generate a divided voltage. The first ADC 2 generates the first digital signal D1 according to a differential voltage between a divided voltage and the first reference voltage VREF1. Since feedback control is performed to make a divided voltage match the first reference voltage VREF1 ultimately, the voltage level of the first reference voltage VREF1 can be lowered.

Meanwhile, the replica circuit 4 outputs a replica voltage at a voltage level comparable with that of the output stage circuit 3. The second reference voltage VREF2 is set to the same voltage level as the first reference voltage VREF1. Accordingly, the second reference voltage VREF2 is multiplied by A by the voltage amplifier 22 to have a voltage level comparable with that of a replica voltage.

In this way, in the case of the configuration of FIG. 19, since the voltage divider resistor circuit 21 and the voltage amplifier 22 are included, even when the voltage level of the output voltage Vout is high, the first reference voltage VREF1 and the second reference voltage VREF2 can be at a low voltage level, so that the power consumption can be reduced.

In this way, in the present embodiment, since the replica circuit 4 having the same circuit configuration as the output stage circuit 3 is provided, and the second digital signal D2 including performance information regarding the replica circuit 4 is supplied to the control circuit 6, the control circuit 6 can output, when performing digital LDO operation, the output voltage Vout by taking into consideration performance information regarding the output stage circuit 3. Thus, the output voltage Vout independent of performance information regarding the output stage circuit 3, such as the input voltage, the output voltage Vout, the manufacturing process, and the temperature, can be generated.

Further, according to the present embodiment, even when a load current is changed, fluctuation of the ripple voltage and the droop characteristics can be suppressed.

Moreover, according to the present embodiment, since the effect of variations in the performance of the output stage circuit 3 is reduced, there is no need for the digital control regulators 1 to 1i to have complex circuit configurations, so that the stability can be enhanced. More specifically, in the present embodiment, since a multiloop configuration for digital LDO operation is not required, the control is facilitated, and the stability is thus enhanced.

Further, according to the present embodiment, the circuits with lower voltage and smaller area than the current performance correction circuit 8, which is controlled in an analog manner, can be configured, and the integration is facilitated so that the manufacturing cost can be reduced.

Note that the present technology can take the following configurations.

(1) A digital control regulator, including:
a first A/D converter configured to generate a first digital signal according to a differential voltage between an output voltage and a first reference voltage;
an output stage circuit configured to generate the output voltage;
a replica circuit having the same circuit configuration as the output stage circuit and configured to output a replica voltage related to the output voltage;
a second A/D converter configured to generate a second digital signal according to a differential voltage between the replica voltage and a second reference voltage; and
a control circuit configured to generate a control signal for controlling a gain of the output stage circuit, according to the first digital signal and the second digital signal.

(2) The digital control regulator according to (1),
in which the output stage circuit and the replica circuit include circuits having the same circuit configuration and including transistors having the same conductivity type and the same size.

(3) The digital control regulator according to (1),
in which the output stage circuit and the replica circuit include circuits having the same circuit configuration and including resistance elements having the same resistance value.

(4) The digital control regulator according to any one of (1) to (3),
in which the second digital signal includes performance information regarding the replica circuit.

(5) The digital control regulator according to (4),
in which the control circuit generates the control signal in such a manner that the output voltage is not affected by a fluctuation in performance information regarding the output stage circuit.

(6) The digital control regulator according to (4) or (5),
in which the performance information includes at least one piece of information regarding an input voltage, an output voltage, a manufacturing process, and a temperature of the replica circuit or the output stage circuit.

(7) The digital control regulator according to any one of (1) to (6),
in which the second digital signal includes on-resistance information regarding the replica circuit.

(8) The digital control regulator according to (7),
in which the control circuit generates, according to the second digital signal, the control signal for making on-resistance of the output stage circuit match on-resistance of the replica circuit.

(9) The digital control regulator according to any one of (1) to (8),
in which the replica circuit outputs the replica voltage before start of feedback control of the output voltage by the output stage circuit and the control circuit or in synchronization with a start timing of the feedback control, and
the second A/D converter generates the second digital signal before the start of the feedback control of the output voltage by the output stage circuit and the control circuit or in synchronization with the start timing of the feedback control.

(10) The digital control regulator according to (9),
in which the replica circuit outputs the replica voltage in synchronization with a timing at which a voltage level of the output voltage has been switched during the feedback control of the output voltage by the output stage circuit and the control circuit, and
the second A/D converter generates the second digital signal in synchronization with the timing at which the voltage level of the output voltage has been switched during the feedback control of the output voltage by the output stage circuit and the control circuit.

(11) The digital control regulator according to (9) or (10),
in which the replica circuit outputs the replica voltage a predetermined period before a timing at which a voltage level of the output voltage is switched during the feedback control of the output voltage by the output stage circuit and the control circuit, and
the second A/D converter generates the second digital signal at the timing at which the voltage level of the output voltage has been switched during the feedback control of the output voltage by the output stage circuit and the control circuit.

(12) The digital control regulator according to any one of (1) to (8),
in which the replica circuit intermittently outputs the replica voltage during feedback control of the output voltage by the output stage circuit and the control circuit, and
the second A/D converter intermittently generates the second digital signal during the feedback control of the output voltage by the output stage circuit and the control circuit.

(13) The digital control regulator according to any one of (1) to (8), in which the replica circuit continuously outputs the replica voltage during feedback control of the output voltage by the output stage circuit and the control circuit, and the second A/D converter continuously generates the second digital signal during the feedback control of the output voltage by the output stage circuit and the control circuit.

(14) The digital control regulator according to any one of (9) to (13), in which the replica circuit outputs the replica voltage when an enable signal has a predetermined logic and stops outputting the replica voltage when the enable signal has a logic other than the predetermined logic.

(15) The digital control regulator according to (14), in which the second reference voltage is input to the second A/D converter at a timing at which the enable signal takes the predetermined logic.

(16) The digital control regulator according to any one of (1) to (15), in which the second A/D converter includes:
a comparator configured to output a signal according to the differential voltage between the replica voltage and the second reference voltage;
a variable load circuit configured to adjust a current flowing to an output node of the replica circuit, thereby controlling a voltage level of the replica voltage; and
a control unit configured to, according to an output signal from the comparator, adjust a current flowing to the variable load circuit through the output node and generate the second digital signal including on-resistance information regarding the replica circuit for making the replica voltage match the second reference voltage.

(17) The digital control regulator according to any one of (1) to (15), in which the replica circuit includes a transistor or a resistance element, the number of connected stages of which is adjustable, and the second A/D converter includes:
a comparator configured to output a signal according to the differential voltage between the replica voltage and the second reference voltage; and
a control unit configured to, according to an output signal from the comparator, adjust the number of connected stages of the transistor or the resistance element in the replica circuit and generate the second digital signal including on-resistance information regarding the replica circuit for making the replica voltage match the second reference voltage.

(18) The digital control regulator according to any one of (1) to (17), in which the output stage circuit includes a transistor or a resistance element, the number of connected stages of which is adjustable, and the control circuit matches, according to the second digital signal, the number of connected stages of the transistor or the resistance element in the output stage circuit with the number of connected stages of a transistor or a resistance element in the replica circuit.

(19) The digital control regulator according to any one of (1) to (18), in which the control circuit performs feedback control to make the output voltage match the first reference voltage, and the first reference voltage and the second reference voltage are at the same voltage level.

(20) The digital control regulator according to any one of (1) to (18), in which the control circuit performs feedback control to make a voltage obtained by dividing the output voltage with a ratio of 1/A (A is a real number larger than 1) match the first reference voltage, the second reference voltage is set to the same voltage level as the first reference voltage, and the second A/D converter compares the replica voltage to a voltage obtained by multiplying the second reference voltage by A.

The aspects of the present disclosure are not limited to the individual embodiments described above but also include various modifications that can be conceived by those skilled in the art, and the effects of the present disclosure are not limited to the contents described above either. That is, various additions, changes, and partial omissions are possible without departing from the conceptual idea and gist of the present disclosure derived from the contents defined in the claims and its equivalents.

REFERENCE SIGNS LIST 1, 1a, 1b, 1c, 1d, 1e, 1f, 1g, 1h, 1i: Digital control regulator
2: First ADC
3: Output stage circuit
4: Replica circuit
5: Second ADC
6: Control circuit
7: Digital LDO circuit
8: Performance correction circuit
11: Comparator
12: Variable current source
13: Control unit
14: First reference voltage generation circuit
15: Second reference voltage generation circuit
16: Variable load circuit
17: First current source
18: First variable resistor
19: Second current source
20: Second variable resistor

The invention claimed is:

1. A digital control regulator, comprising:
an output stage circuit configured to generate an output voltage;
a first A/D converter configured to generate a first digital signal based on a first differential voltage between the output voltage and a first reference voltage;
a replica circuit configured to output a replica voltage corresponding to the output voltage, wherein
a circuit configuration of the replica circuit is same as a circuit configuration of the output stage circuit;
a second A/D converter configured to generate a second digital signal based on a second differential voltage between the replica voltage and a second reference voltage; and
a control circuit configured to:
generate a control signal based on the first digital signal and the second digital signal; and
control a gain of the output stage circuit based on the generated control signal, wherein
the output stage circuit and the control circuit are further configured to perform feedback control of the output voltage, the replica circuit is further configured to output the replica voltage before start of the feedback control of the output voltage or in synchronization with a start timing of the feedback control, and the second A/D converter is further configured to generate the second digital signal before the start of the feedback control of the output voltage or in synchronization with the start timing of the feedback control.

2. The digital control regulator according to claim 1, wherein each of the output stage circuit and the replica circuit includes circuits, the circuits of the output stage circuit and the circuits of the replica circuit have a same circuit configuration, each of the circuits of the output stage circuit and the circuits of the replica circuit includes at least one transistor, and the at least one transistor of the output stage circuit and the at least one transistor of the replica circuit have a same conductivity type and a same size.

3. The digital control regulator according to claim 1, wherein each of the output stage circuit and the replica circuit includes circuits, the circuits of the output stage circuit and the circuits of the replica circuit have a same circuit configuration, each of the circuits of the output stage circuit and the circuits of the replica circuit includes at least one resistance element, and the at least one resistance element of the output stage circuit and the at least one resistance element of the replica circuit have a same resistance value.

4. The digital control regulator according to claim 1, wherein the second digital signal includes first performance information regarding the replica circuit.

5. The digital control regulator according to claim 4, wherein based on the generated control signal the output voltage is unaffected by a fluctuation in second performance information regarding the output stage circuit.

6. The digital control regulator according to claim 4, wherein the first performance information includes information regarding an input voltage, the output voltage, a manufacturing process, and a temperature of the replica circuit or the output stage circuit.

7. The digital control regulator according to claim 1, wherein the second digital signal includes on-resistance information regarding the replica circuit.

8. The digital control regulator according to claim 7, wherein the control circuit is further configured to generate the control signal based on the second digital signal to match an on-resistance of the output stage circuit with an on-resistance of the replica circuit.

9. The digital control regulator according to claim 1, wherein the replica circuit is further configured to output the replica voltage in synchronization with a timing at which a voltage level of the output voltage is switched during the feedback control of the output voltage, and the second A/D converter is further configured to generate the second digital signal in synchronization with the timing at which the voltage level of the output voltage is switched during the feedback control of the output voltage.

10. The digital control regulator according to claim 1, wherein the replica circuit is further configured to output the replica voltage at a specific period before a timing at which a voltage level of the output voltage is switched during the feedback control of the output voltage, and the second A/D converter is further configured to generate the second digital signal at the timing at which the voltage level of the output voltage is switched during the feedback control of the output voltage.

11. The digital control regulator according to claim 1, wherein the replica circuit is further configured to intermittently output the replica voltage during the feedback control of the output voltage, and the second A/D converter is further configured to intermittently generate the second digital signal during the feedback control of the output voltage.

12. The digital control regulator according to claim 1, wherein the replica circuit is further configured to continuously output the replica voltage during the feedback control of the output voltage, and the second A/D converter is further configured to continuously generate the second digital signal during the feedback control of the output voltage.

13. The digital control regulator according to claim 1, wherein the replica circuit is further configured to:

output the replica voltage based on an enable signal has a first logic; and stop the output of the replica voltage based on the enable signal that has a second logic, wherein the second logic is different from the first logic.

14. The digital control regulator according to claim 13, wherein the second A/D converter is further configured to receive the second reference voltage at a timing at which the enable signal takes the first logic.

15. The digital control regulator according to claim 1, wherein the second A/D converter includes:

a comparator configured to output a signal based on the second differential voltage between the replica voltage and the second reference voltage;

a variable load circuit configured to:

adjust a first current that flows to an output node of the replica circuit; and control a voltage level of the replica voltage based on the adjusted first current; and a control unit configured to;

adjust a second current that flows to the variable load circuit through the output node based on the signal output from the comparator; and generate the second digital signal that includes on-resistance information regarding the replica circuit, wherein the replica voltage matches the second reference voltage.

16. The digital control regulator according to claim 1, wherein the replica circuit includes one of a transistor or a resistance element, a number of connected stages of the transistor or the resistance element is adjustable, and the second A/D converter includes:

a comparator configured to output a signal based on the second differential voltage between the replica voltage and the second reference voltage; and a control unit configured to:

adjust the number of the connected stages of the transistor or the resistance element in the replica circuit based on the signal output from the comparator; and
generate the second digital signal that includes on-resistance information regarding the replica circuit, wherein the replica voltage matches the second reference voltage.

17. The digital control regulator according to claim 1, wherein
the output stage circuit includes one of a transistor or a resistance element,
a number of connected stages of the transistor or the resistance element is adjustable, and
the control circuit is further configured to match, based on the second digital signal, the number of the connected stages of the transistor or the resistance element in the output stage circuit with the number of the connected stages of a transistor or a resistance element in the replica circuit.

18. The digital control regulator according to claim 1, wherein
the control circuit is further configured to perform the feedback control to match the output voltage with the first reference voltage, and
the first reference voltage and the second reference voltage are at a same voltage level.

19. The digital control regulator according to claim 1, wherein
the control circuit is further configured to perform the feedback control to match a first voltage with the first reference voltage, wherein
the first voltage is obtained based on division of the output voltage with a ratio of 1/A, and
A is a real number larger than 1),
the second reference voltage is set to a same voltage level as the first reference voltage, and
the second A/D converter is further configured to compare the replica voltage to a second voltage obtained based on a multiplication of the second reference voltage by A.

20. A digital control regulator, comprising:
an output stage circuit configured to generate an output voltage;
a first A/D converter configured to generate a first digital signal based on a first differential voltage between the output voltage and a first reference voltage;
a replica circuit configured to output a replica voltage corresponding to the output voltage, wherein
a circuit configuration of the replica circuit is same as a circuit configuration of the output stage circuit;
a second A/D converter configured to generate a second digital signal based on a second differential voltage between the replica voltage and a second reference voltage, wherein the second A/D converter includes:
a comparator configured to output a signal based on the second differential voltage between the replica voltage and the second reference voltage;
a variable load circuit configured to:
adjust a first current that flows to an output node of the replica circuit; and
control a voltage level of the replica voltage based on the adjusted first current; and
a control unit configured to:
adjust a second current that flows to the variable load circuit through the output node based on the signal output from the comparator; and
generate the second digital signal that includes on-resistance information regarding the replica circuit, wherein the replica voltage matches the second reference voltage; and
a control circuit configured to:
generate a control signal based on the first digital signal and the second digital signal; and
control a gain of the output stage circuit based on the generated control signal.

21. A digital control regulator, comprising:
an output stage circuit configured to generate an output voltage;
a first A/D converter configured to generate a first digital signal based on a first differential voltage between the output voltage and a first reference voltage;
a replica circuit configured to output a replica voltage corresponding to the output voltage, wherein
a circuit configuration of the replica circuit is same as a circuit configuration of the output stage circuit,
the replica circuit includes one of a transistor or a resistance element, and
a number of connected stages of the transistor or the resistance element is adjustable;
a second A/D converter configured to generate a second digital signal based on a second differential voltage between the replica voltage and a second reference voltage, wherein the second A/D converter includes:
a comparator configured to output a signal based on the second differential voltage between the replica voltage and the second reference voltage; and
a control unit configured to:
adjust the number of the connected stages of the transistor or the resistance element in the replica circuit based on the signal output from the comparator; and
generate the second digital signal that includes on-resistance information regarding the replica circuit, wherein the replica voltage matches the second reference voltage; and
a control circuit configured to:
generate a control signal based on the first digital signal and the second digital signal; and
control a gain of the output stage circuit based on the generated control signal.

* * * * *